United States Patent [19]

le Goff

[11] Patent Number: 4,541,141

[45] Date of Patent: Sep. 17, 1985

[54] MACHINE FOR WASHING ELECTRONIC CIRCUITS

[75] Inventor: Yves le Goff, Versailles, France

[73] Assignee: Electronique Serge Dassault, Paris, France

[21] Appl. No.: 442,745

[22] Filed: Nov. 18, 1982

[30] Foreign Application Priority Data

Nov. 19, 1981 [FR] France ................... 81 21715

[51] Int. Cl.[4] .............................................. B08B 3/02
[52] U.S. Cl. ...................................... 15/302; 15/306 B; 134/153
[58] Field of Search .............. 15/302, 306 R, 306 B, 15/316 R, 304; 134/172, 137, 138, 148, 153

[56] References Cited

U.S. PATENT DOCUMENTS

| 187,163 | 2/1877 | Miller | 134/138 |
|---|---|---|---|
| 1,176,866 | 3/1916 | Smith | 134/138 |
| 2,566,142 | 8/1951 | Powers | 15/302 X |
| 3,136,323 | 6/1964 | Martz et al. | 134/153 X |
| 3,161,576 | 12/1964 | Teichner et al. | 204/143 |
| 3,182,671 | 5/1965 | Vorie | 134/153 X |
| 3,422,826 | 1/1969 | Ballard | 134/107 |
| 3,494,815 | 2/1970 | Voshimatsu | 134/153 X |
| 3,498,303 | 3/1970 | Eaves et al. | 15/302 X |
| 3,868,272 | 2/1975 | Tardoskegyi | 134/131 X |
| 3,983,597 | 10/1976 | Neumann | 15/304 |
| 3,990,462 | 11/1976 | Elftmann et al. | 134/102 |
| 4,208,760 | 6/1980 | Dexter et al. | 15/302 |

Primary Examiner—Chris K. Moore
Attorney, Agent, or Firm—Karl F. Ross; Herbert Dubno

[57] ABSTRACT

A rotatable tray for supporting at least one package together with at least one nozzle for projecting a jet of liquid along an axis which is substantially at 45° to the axis of rotation of the tray.

10 Claims, 5 Drawing Figures

MACHINE FOR WASHING ELECTRONIC CIRCUITS

The invention relates to a machine for washing electronic circuits, in particular so-called "hybrid" electronic circuits.

BACKGROUND OF THE INVENTION

Hybrid electronic circuits are usually mounted inside a package which is intended to be closed by a lid. If the hybrid circuit is to operate properly, it is imperative that no impurities exist inside the package.

Thus, up to now, extraordinary precautions have been taken in the manufacture of hybrid circuits: manufacture takes place in "clean" rooms having a purified atmosphere; and the staff wear clothing and head-gear, etc. designed to maintain conditions of purity.

Proposals have been made to use a jet of washing liquid, usually alcohol, to wash the inside of a package in which a hybrid circuit is mounted before the package is closed by a lid. Such a washing operation is performed manually, takes a relatively long time and only gives very imperfect results. This insufficiency stems from the fact that the various electronic components inside a package have surfaces facing in different directions providing irregularities or nooks which are difficult for projected washing liquid to reach.

OBJECT OF THE INVENTION

The object of the invention is to provide a washing machine whose very design enables the washing liquid to reach all the places where an impurity could be lodged, in spite of the multiplicity of orientations of the faces delimiting the components of the hybrid circuit. Indeed, the machine makes use of the diversity of orientations to improve the efficiency of the liquid wash.

SUMMARY OF THE INVENTION

The machine according to the invention uses a projected washing liquid, in which the direction of projection is theoretically fixed while the package housing the hybrid circuit is moved relative to the source of liquid to successively present the various faces of its components transversally to the jet.

In one embodiment, the washing machine comprises a plurality of liquid projection nozzles which are theoretically fixed, and a package support rotatably mounted about an axis which is inclined relative to the direction of projection, and advantageously at 45° relative thereto.

Once a hybrid circuit has passed in front of the jets, all of the various faces of its electronic components have been placed, at least once, in the best conditions for being washed, so that the washing is, over all, maximally effective.

The invention also positions the jets in such a manner as to enable the liquid to reach the hybrid circuits via the upper portion thereof, thereby facilitating recovery of the washing liquid.

Additionally, a machine according to the invention may be equipped with means for projecting gas jets, thus enabling the hydrid circuits to be dried and dehydrated after being washed.

BRIEF DESCRIPTION OF THE DRAWING

In the following description which is given by way of example, reference is made to the accompanying drawing, in which.

SPECIFIC DESCRIPTION

Figure 1:
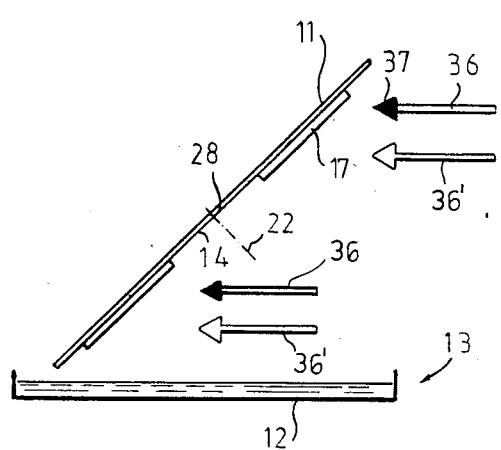
FIG. 1 is a diagrammatic vertical section through a portion of a machine in accordance with the invention.
Figure 2:
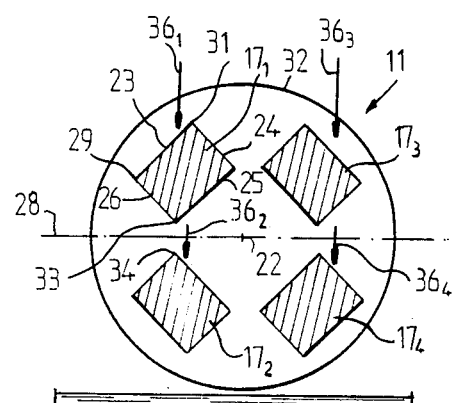
FIG. 2 is a perpendicular view of the above, with the plane of the figure being parallel to a tray carrying the packages.
Figure 3:
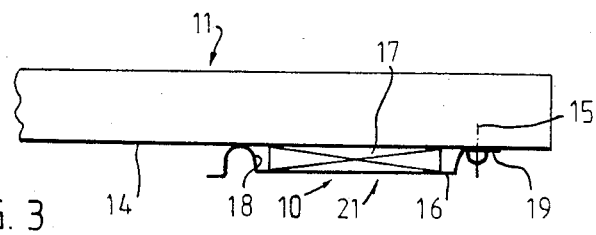
FIG. 3 is a diagrammatic view on a larger scale showing a means for fixing a package on the tray.

The machine for washing electronic components such as hybrid circuits contained in parallelipiped shaped packages without their lids on, comprises a tray or disk 11 (FIG. 1) which is inclined at 45° to a horizontal base 12 of a tank 13 disposed underneath the disk. The downwardly turned face 14 of the disk 11 is provided with releasable fixing means, e.g. comprising a clip 10 (FIG. 3) rotatably mounted about an axis 15 and comprising a flat blade 16 suitable for placing over the side of a package body with a curved blade end 18 opposite to the rotatably mounted end 19 being suitable for bearing against the face 14 of the disk 11. These fixing means 21 enable four packages $17_1$, $17_2$, $17_3$, and $17_4$ (FIG. 2) to be fixed on the disk 11 at equal angles spaced around the axis 22 on which the disk or tray is rotatably mounted.

A greater number of smaller sized packages can be mounted on the disk 11 using the fixing means, eg. up to twelve packages.

The packages 17 are disposed on the disk 11 in such a manner that the various faces 23, 24, 25, and 26 of the parallelipipeds are inclined at 45° relative to the horizontal diameter 28 of the disk 11. The outside edges 29 and 31 of the package $17_1$ are relatively close to the peripheral edge 32 of the disk 11. The package $17_2$ is symmetrically placed relative to the package $17_1$ about the horizontal diameter 28, and the package $17_4$ is symmetrically disposed relative to the package $17_3$ about the same diameter. The facing edges of the symmetrical packages, as shown at 33 and 34, do not touch one another.

Four horizontal nozzles $36_1$, $36_2$, $36_3$, and $36_4$, are disposed in an array around the center of disk 11 opposite the face 14 of the disk and within the horizontally projected outline thereof. The ends 37 of the nozzles are at a greater distance from the face 14 of the disk 11 than the height of any of the packages, and they are at substantially the same distance from the axis 22 of the disk 11 as are the outside edges of the packages, as shown at 29 and 31 for the package $17_1$.

Advantageously, the nozzles used are jet nozzles 35 having an orifice 30 which is adjustable by means of a knurled ring 40, and which is adjusted such that liquid is projected in a jet of the shape of a cone having an angle of about 60°.

Figure 5:
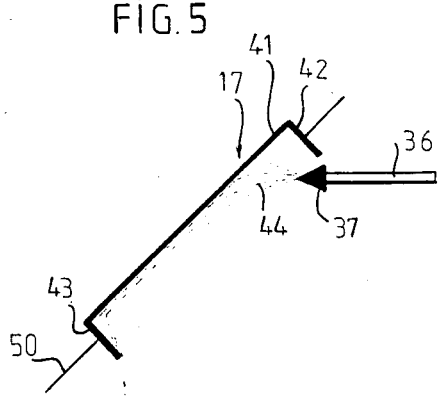
FIG. 5 is a diagrammatic section through a package as placed on the tray and subjected to a washing jet.
Figure 4:
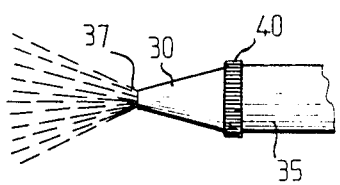
FIG. 4 is a side view of a projection nozzle.

FIG. 5 shows a package 17 having a base 41 parallel to the disk 11, and sides 42 and 43 from which leads 50 project to connect components contained inside the package with other components.

As the disk 11 is rotated, each of the faces or facts of the components making up the hybrid circuit contained in the package 17 is subjected to the action of the jets of liquid escaping from the ends 37 of the nozzles 36, and this happens at an angle that varies relative to the axis of the jet, the angle varying not only relative to the direction of any one nozzle 36, but also after passing in front of one nozzle, as the package passes in front of another nozzle. When a package containing a hybrid circuit has made a complete turn about the axis, the package has been subjected to the action of a jet of washing liquid from all angles, and this is applicable regardles of the orientation of the face. The resulting washing is thus practically perfect, washing out all the impurities that there may be inside the package 17.

The liquid 44 leaving the nozzle 36 runs along the hybrid circuit contained in the package 17 and the side 43 facilitates its return to the tank 13.

Each liquid projection nozzle is advantageously associated with a gas jet nozzle 36′. This makes it possible to dry and dehydrate after washing.

I claim:

1. A washing machine for electronic components disposed in a package, comprising;
    a circular tray rotatable about an axis inclined at 45° to the horizontal, whereby said tray has a surface lying at an angle of 45° to the horizontal, said tray supporting on said surface at least one package to be washed, so that said package orbits said axis; and
    a plurality of nozzles having horizontal axes and disposed in an array around the center of said tray within the horizontally projected outline of said tray for training respective jets of liquid at different points at different quadrants around said tray, whereby upon rotation of said tray, said package passes through each of the respective jets to be washed, with the angle at which each jet is trained upon said package varying as the package passes therethrough, and the angle with which each jet is trained upon said package differing from jet to jet.

2. A washing machine according to claim 1, wherein the tray is provided with means for supporting a plurality of packages.

3. A washing machine according to claim 2, wherein the tray is provided with means for supporting between four and twelve packages.

4. A washing machine according to claim 2, wherein the number of packages is equal to the number of nozzles.

5. A washing machine according to claim 2, wherein the packages are identically disposed on the tray.

6. A washing machine according to claim 5, wherein the packages are disposed at equal angle spacing around the tray.

7. A washing machine according to claim 6 wherein the packages are of rectangular configuration, their side faces being inclined at 45° to the horizontal at a plurality of points upon rotation of the tray.

8. A washing machine according to claim 1, wherein the tray is above a tank for recovering the washing liquid.

9. A washing machine according to claim 1, which further comprises gas projection nozzles trained at said tray for drying said package.

10. A washing machine according to claim 9, wherein a respective gas projection nozzle is associated with each liquid projection nozzle.

* * * * *